United States Patent
McDonald et al.

(10) Patent No.: US 9,065,416 B2
(45) Date of Patent: Jun. 23, 2015

(54) METHODS AND SYSTEMS FOR CONTROLLING THE VOLUME OF INFOTAINMENT UNITS OF VEHICLES

(75) Inventors: Mike M. McDonald, Macomb, MI (US); William C. Albertson, Clinton Township, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 1739 days.

(21) Appl. No.: 12/486,840

(22) Filed: Jun. 18, 2009

(65) Prior Publication Data

US 2010/0324804 A1 Dec. 23, 2010

(51) Int. Cl.
*F02D 41/06* (2006.01)
*H03G 3/32* (2006.01)
*H03G 3/30* (2006.01)

(52) U.S. Cl.
CPC . *H03G 3/32* (2013.01); *H03G 3/301* (2013.01)

(58) Field of Classification Search
USPC .......... 701/112–114, 1, 36; 123/179.1, 179.2, 123/198 DB, 198 F; 381/57, 94.1, 86, 104, 381/106–109
See application file for complete search history.

(56) References Cited

U.S. PATENT DOCUMENTS

| | | | | |
|---|---|---|---|---|
| 4,558,460 A | * | 12/1985 | Tanaka et al. | 381/86 |
| 5,677,960 A | * | 10/1997 | Unno et al. | 381/86 |
| 6,580,984 B2 | * | 6/2003 | Fecher et al. | 701/36 |
| 6,587,756 B2 | * | 7/2003 | Moriguchi et al. | 701/1 |
| 6,937,142 B2 | * | 8/2005 | Theiss et al. | 340/436 |
| 7,015,799 B1 | * | 3/2006 | Kitano et al. | 340/425.5 |
| 7,292,152 B2 | * | 11/2007 | Torkkola et al. | 340/576 |
| 7,417,396 B2 | * | 8/2008 | Yoshida et al. | 318/466 |
| 2002/0045973 A1 | * | 4/2002 | Odashima et al. | 701/1 |
| 2002/0141600 A1 | * | 10/2002 | Siwinski | 381/86 |
| 2004/0086134 A1 | * | 5/2004 | Matsuoka et al. | 381/71.4 |
| 2005/0213776 A1 | * | 9/2005 | Honji et al. | 381/86 |
| 2006/0243255 A1 | * | 11/2006 | Ma et al. | 123/491 |
| 2008/0012731 A1 | * | 1/2008 | Krippgans | 340/989 |
| 2008/0122391 A1 | * | 5/2008 | Iwase et al. | 318/460 |
| 2009/0080673 A1 | * | 3/2009 | Laurent | 381/86 |

FOREIGN PATENT DOCUMENTS

JP 2001034274 * 2/2001 ............. G10K 15/00

OTHER PUBLICATIONS

Translation of Japanese Publication of JP-2001034274.*

* cited by examiner

*Primary Examiner* — John Kwon
*Assistant Examiner* — Johnny Hoang
(74) *Attorney, Agent, or Firm* — Ingrassia Fisher & Lorenz, P.C.

(57) ABSTRACT

A method for controlling a volume of an infotainment unit of a vehicle having an engine having a stop/start capability during operation of the vehicle includes the steps of obtaining information pertaining to a condition of the engine, and controlling the volume based at least in part upon the condition.

17 Claims, 4 Drawing Sheets

METHODS AND SYSTEMS FOR CONTROLLING THE VOLUME OF INFOTAINMENT UNITS OF VEHICLES

TECHNICAL FIELD

The present invention generally relates to the field of vehicles and, more specifically, to methods and systems for controlling the volume of infotainment units of vehicles.

BACKGROUND OF THE INVENTION

Certain vehicles today include a stop/start feature for an engine of the vehicle. Such a stop/start feature typically includes the ability for the vehicle to automatically turn off and re-start the engine during appropriate circumstances as the vehicle is operating. For example, a vehicle with a stop/start feature may automatically turn off the engine while the driver is engaging the brake pedal and the vehicle is stopped (for example, at a stop light), and the vehicle may subsequently turn on the engine when the driver releases the brake pedal and/or engages the accelerator pedal of the vehicle.

Such stop/start features of vehicles can be advantageous, for example in saving fuel, increasing fuel efficiency for the vehicle, and reducing fuel expenses for the driver. However, such stop/start engine operation may increase noise in the cabin of the vehicle, which may in turn affect the driver's and/or other occupant's ability to hear content from information and entertainment devices (collectively referred to herein as infotainment units), such as radios, compact disk players, DVD players, cassette players, telephones, audible navigation systems, other vehicle-to-driver communication systems, and/or other types of infotainment units, at a desired level of volume for a short period of time.

Accordingly, it is desirable to provide an improved method for controlling a volume of an infotainment unit of a vehicle based on a condition of the engine having a stop/start feature. It is also desirable to provide an improved program product for such controlling of a volume of an infotainment unit of a vehicle. It is further desirable to provide an improved system for such controlling of a volume of an infotainment unit of a vehicle. Furthermore, other desirable features and characteristics of the present invention will be apparent from the subsequent detailed description and the appended claims, taken in conjunction with the accompanying drawings and the foregoing technical field and background.

SUMMARY OF THE INVENTION

In accordance with an exemplary embodiment of the present invention, a method for controlling a volume of an infotainment unit of a vehicle having an engine having a stop/start capability during operation of the vehicle is provided. The method comprises the steps of obtaining information pertaining to a condition of the engine, and controlling the volume based at least in part upon the condition.

In accordance with another exemplary embodiment of the present invention, a program product for controlling a volume of an infotainment unit of a vehicle having an engine having a stop/start capability during operation of the vehicle is provided. The program product comprises a program and a computer-readable signal-bearing media. The program is configured to obtain information pertaining to a condition of the engine, and to control the volume based upon the condition. The computer-readable signal-bearing media bears the program.

In accordance with a further exemplary embodiment of the present invention, a system for controlling a volume of an infotainment unit of a vehicle having an engine having a stop/start capability during operation of the vehicle is provided. The system comprises one or more sensors and a processor. The one or more sensors are configured to obtain information pertaining to a condition of the engine. The processor is coupled to the sensor, and is configured to control the volume based upon the condition.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
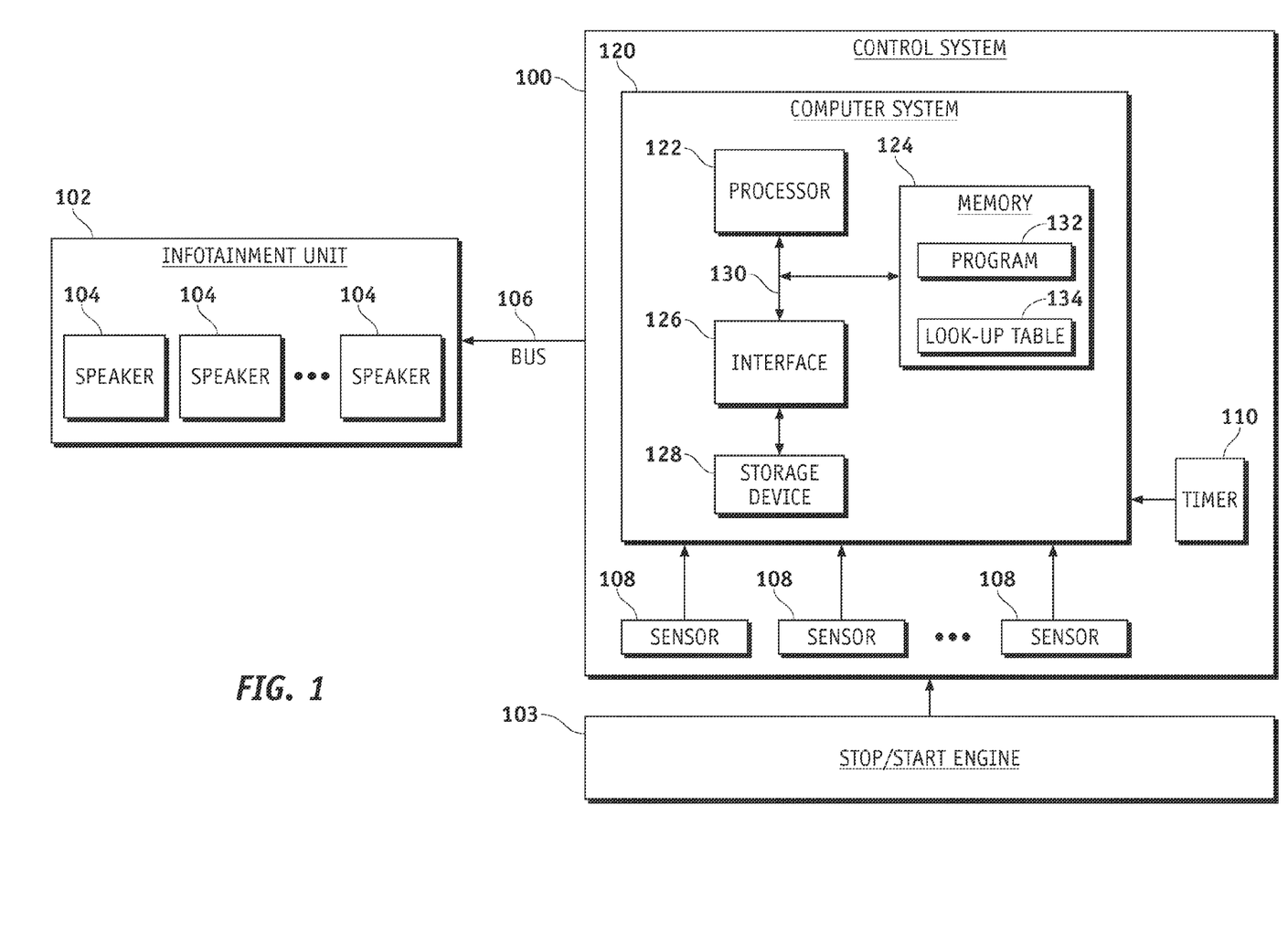
FIG. 1 is a functional block diagram of a control system in controlling the volume of an infotainment unit of a vehicle having an engine with a stop/start feature, in accordance with an exemplary embodiment of the present invention.

FIG. 1 is a block diagram of an exemplary control system 100 for controlling an infotainment unit 102 of a vehicle having a stop/start feature for an engine 103. In one preferred embodiment, the vehicle comprises a hybrid vehicle having a gas combustion stop/start engine 103. In another preferred embodiment, the vehicle comprises a hybrid electric vehicle having a gas combustion stop/start engine 103.

As referenced above and as generally known in the field, a start/stop feature of a vehicle typically includes the ability for the vehicle to automatically turn off and re-start the engine 103 during appropriate circumstances as the vehicle is operating. For example, as referenced above, a vehicle with a stop/start feature may automatically turn off the engine 103 while the driver is engaging the brake pedal and the vehicle is stopped (for example, at a stop light), and the vehicle may subsequently turn on the engine 103 when the driver releases the brake pedal and/or engages the accelerator pedal of the vehicle. The turning off and starting of the engine 103 in connection with such circumstances and/or in connection with related and/or analogous circumstances will be collectively referred to herein as a stop/start event.

The infotainment unit 102 may comprise any one or more of a number of different types of information and/or entertainment units, devices, and/or systems (collectively referred to herein as infotainment units), such as radios, compact disk players, DVD players, cassette players, telephones, audible navigation systems, other vehicle-to-driver communication systems, and/or other types of infotainment units. The infotainment unit 102 preferably includes one or more speakers 104 as depicted in FIG. 1. Also, in various embodiments, the control system 100 controls the volume in any number of different types of infotainment units.

The control system 100 is coupled to the stop/start engine 103 and to the infotainment unit 102. The control system 100 obtains information as to various conditions of the engine 103, processes the information pertaining to the one or more conditions of the engine 103, and controls the volume of the infotainment unit 102 (or multiple infotainment units 102) based at least in part thereon.

In a preferred embodiment, the control system 100 is coupled to the infotainment unit 102 via a bus 106. The bus 106 may comprise any one or more of a number of different types of buses, data links, and/or communications links, such as one or more infotainment buses known in the art. In one preferred embodiment, the control system 100 is part of an engine control system of the vehicle. In another preferred embodiment, the control system 100 is part of an infotainment control system of the vehicle. In yet other embodiments, the control system 100 is part of an engine control system and part of an infotainment control system of a vehicle, and/or is part of one or more other different types of vehicle systems, units, and/or devices.

In the depicted embodiment, the control system 100 includes one or more sensors 108, a timer 110, and a computer system 120. The sensors 108 are coupled to the engine 103 and also to the computer system 120. Specifically, the sensors 108 obtain information pertaining to various conditions of the engine 103 (for example, whether the engine 103 is running, cranking, or turned off, and whether the engine 103 is in the process of an initial start of the engine 103 during a vehicle drive, or a stop/start event following the initial start of a vehicle drive, or a current ignition key switch cycle), and provides this information to the computer system 120 for processing and for use in controlling the volume of the infotainment unit 102, in accordance with the steps of the process 200 depicted in FIGS. 2(A) and 2(B) and described further below in connection therewith. The number of sensors 108 may vary in various embodiments. In addition, any number of different types of sensors 108 may be utilized in various embodiments, including switch contact sensing circuits.

The timer 110 is coupled to the computer system 120. The timer 110 keeps track of time during a stop/start event of the engine 103 and provides values pertaining thereto to the computer system 120. Specifically, in accordance with a preferred embodiment, during a particular stop/start engine cranking event, the timer 110 continually keeps track of an amount of time since the start of the stop/start cranking event, and continually provides information as to this amount of time to the computer system 120 for processing and for use in controlling the volume of the infotainment unit 102, in accordance with the steps of the process 200 depicted in FIGS. 2(A) and 2(B) and described further below in connection therewith.

The computer system 120 is coupled to the sensors 108, to the timer 110, and to the infotainment unit 102. In the depicted embodiment, the computer system 120 includes a processor 122, a memory 124, an interface 126, a storage device 128, and a computer bus 130. The processor 122 performs the computation and control functions of the computer system 120 and the control system 100, and may comprise any type of processor or multiple processors, single integrated circuits such as a microprocessor, or any suitable number of integrated circuit devices and/or circuit boards working in cooperation to accomplish the functions of a processing unit. During operation, the processor 122 executes one or more programs 132 contained within the memory 124 and, as such, controls the general operation of the computer system 120.

The memory 124 can be any type of suitable memory. This could include the various types of dynamic random access memory (DRAM) such as SDRAM, the various types of static RAM (SRAM), and the various types of non-volatile memory (PROM, EPROM, and flash). Also as depicted in FIG. 1, the memory 124 preferably stores the program 132 and a look-up table 134 for use in executing the steps of various processes such as the process 200 of FIGS. 2(A) and 2(B). The computer bus 130 serves to transmit programs, data, status and other information or signals between the various components of the computer system 120.

The interface 126 allows communication to the computer system 120, for example from a system driver and/or another computer system, and can be implemented using any suitable method and apparatus. It can include one or more network interfaces to communicate with other systems or components. The interface 126 may also include one or more network interfaces to communicate with technicians, and/or one or more storage interfaces to connect to storage apparatuses, such as the storage device 128.

The storage device 128 can be any suitable type of storage apparatus, including direct access storage devices such as hard disk drives, flash systems, floppy disk drives and optical disk drives. In one exemplary embodiment, the storage device 128 comprises a program product from which memory 124 can receive a program 132 that executes one or more embodiments of one or more processes of the present invention, such as the process 200 of FIGS. 2(A) and 2(B) or portions thereof. In another exemplary embodiment, the program product may be directly stored in and/or otherwise accessed by the memory 124 and/or a disk such as that referenced below.

The computer bus 130 can be any suitable physical or logical means of connecting computer systems and components. This includes, but is not limited to, direct hard-wired connections, fiber optics, infrared and wireless bus technologies. During operation, the program 132 is stored in the memory 124 and executed by the processor 122. It will be appreciated that the control system 100 may differ from the embodiment depicted in FIG. 1, for example in that the control system 100 may be coupled to or may otherwise utilize one or more remote computer systems and/or other control systems.

It will be appreciated that while this exemplary embodiment is described in the context of a fully functioning computer system, those skilled in the art will recognize that the mechanisms of the present invention are capable of being distributed as a program product in a variety of forms, and that the present invention applies equally regardless of the particular type of computer-readable signal bearing media used to carry out the distribution. Examples of signal bearing media include: recordable media such as floppy disks, hard drives, memory cards and optical disks, and transmission media such as digital and analog communication links. It will similarly be appreciated that the computer system 120 may also otherwise differ from the embodiment depicted in FIG. 1, for example in that the computer system 120 may be coupled to or may otherwise utilize one or more remote computer systems and/or other control systems.

Figure 2A:
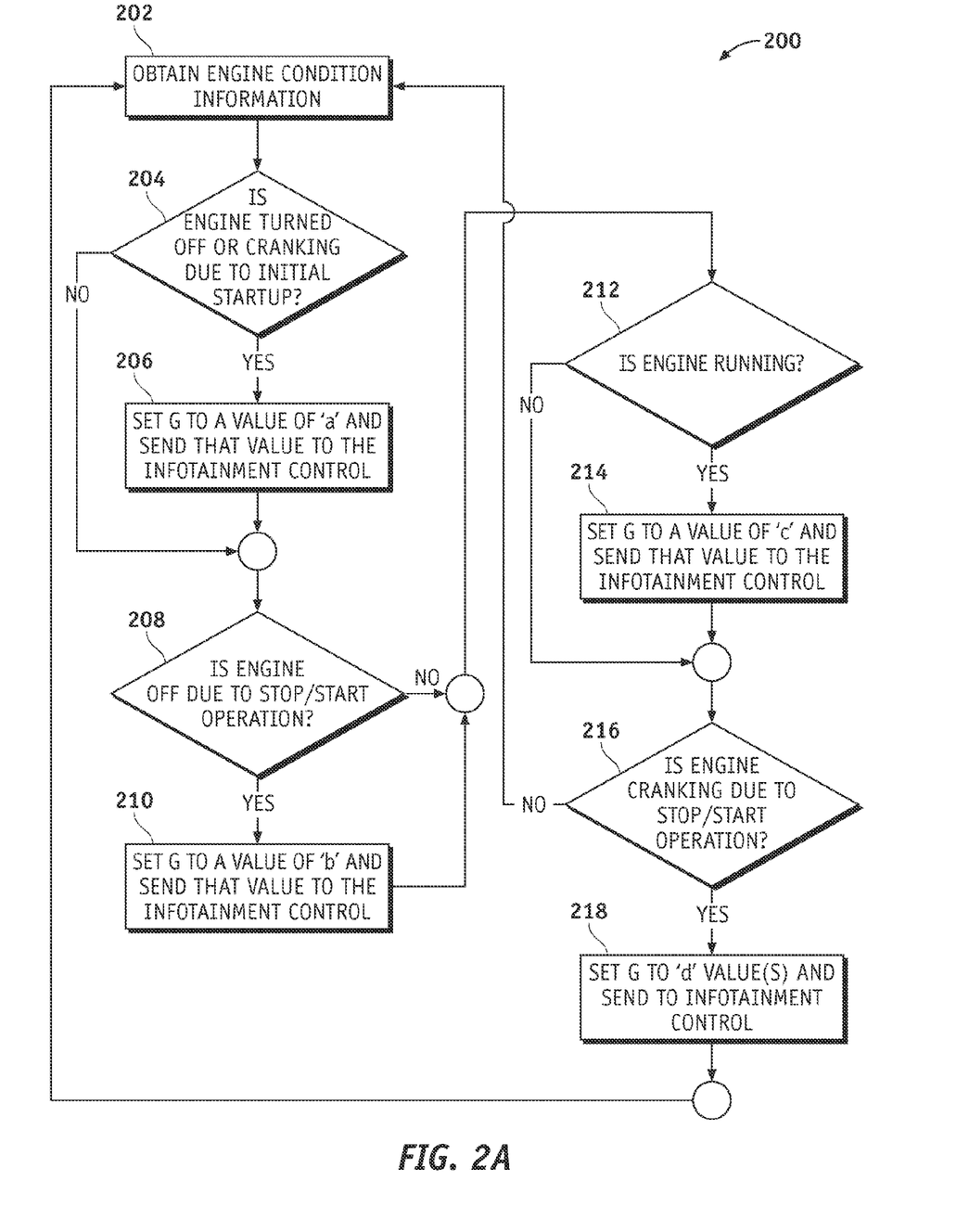
FIGS. 2(A) and 2(B) are flowcharts of a process for controlling the volume of an infotainment unit of a vehicle having an engine with a stop/start feature, and that can be implemented in connection with the control system of FIG. 1, in accordance with an exemplary embodiment of the present invention.
Figure 2B:
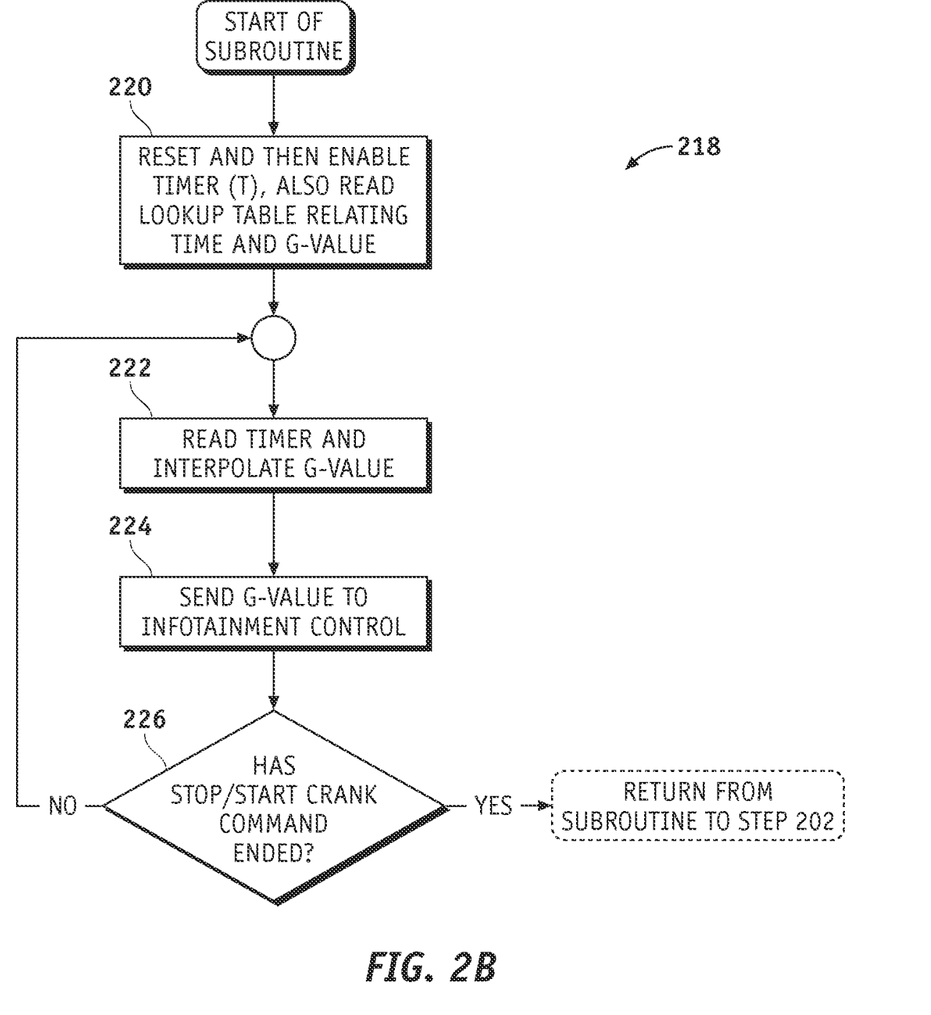

FIGS. 2(A) and 2(B) are flowcharts of a process 200 for controlling the volume of an infotainment unit of a vehicle, in accordance with an exemplary embodiment of the present invention. The process 200 can be implemented in connection with the control system 100 of FIG. 1 and/or the computer system 120 of FIG. 1 and/or program products utilized therewith, in accordance with an exemplary embodiment of the present invention. The process 200 will also be described below in connection with FIGS. 3(A)-3(D), which depict a sequence of graphs showing illustrative examples of volume gains for the control of an infotainment unit of a vehicle in accordance with the control system 100 of FIG. 1 and the process 200 of FIGS. 2(A) and 2(B), in accordance with an exemplary embodiment of the present invention. In addition, while the steps are described in connection with the control of the volume of one infotainment unit of the vehicle, it will be appreciated that the volume of any number of different infotainment units of the vehicle may be controlled, either simultaneously and/or at different times, and either using the same and/or different criteria, in accordance with the steps of the process 200 of FIGS. 2(A) and 2(B). For example, certain speakers may have different gains, or, headset speakers may have different gains.

As depicted in FIGS. 2(A) and 2(B), the process 200 begins with the step of obtaining information pertaining to various conditions of the engine step 202). In a preferred embodiment, the information relates to whether the engine 103 of FIG. 1 is running, cranking, or turned off, and whether the engine 103 of FIG. 1 is in the process of an initial start of the engine 103 of FIG. 1 during a vehicle drive or current ignition key switch cycle, or during a stop/start event following the initial start. Also in a preferred embodiment, the information is obtained by the sensors 108 of FIG. 1 and provided to the processor 122 of FIG. 1 for processing.

A determination is then made as to whether the engine is turned off or cranking during an initial startup of the engine during a vehicle drive or current key switch ignition cycle (step 204). In a preferred embodiment, this determination is made by the processor 122 of FIG. 1 using information provided to the processor 122 by the sensors 108 of FIG. 1 during the above-described step 202.

If it is determined in step 204 that either the engine's ignition key switch is turned off or cranking during an initial startup of the engine 103 during a vehicle drive, then a volume gain for the infotainment system 102 is set to a first level, "a" (step 206). In addition, this value is sent to the infotainment unit and/or a control system therefor for control of the volume of the infotainment unit accordingly, after which the process proceeds to step 208, discussed further below. In a preferred embodiment, the first level of volume gain "a" of step 206 is set to this level by the processor 122 of FIG. 1 and provided to the infotainment unit 102 of FIG. 1 and/or control system therefor via the bus 106 of FIG. 1. Conversely, if it is determined in step 204 that the engine is neither turned off nor cranking during an initial startup of the engine during a vehicle drive, then the process proceeds instead directly to step 208, discussed below.

Figure 3A:
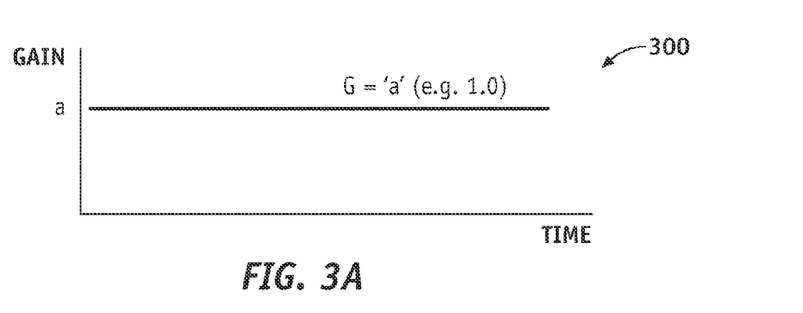
FIGS. 3(A)-3(D) are a sequence of graphs showing illustrative examples of volume gains for the control of the volume of an infotainment unit of a vehicle in accordance with the control system of FIG. 1 and the process of FIGS. 2(A) and 2(B), in accordance with an exemplary embodiment of the present invention.

Turning now to FIG. 3A, an exemplary graph 300 represents an illustrative example of the first level of volume gain "a" of step 206 for the control of the infotainment unit, in accordance with one exemplary embodiment of the present invention. As depicted in FIG. 3A, in this exemplary embodiment, the first level of volume gain "a" is equal to a constant value of 1.0. Thus, in this embodiment, there is no increase in the volume of the infotainment unit under this scenario. However, this may vary in other embodiments of the present invention.

Returning now to FIG. 2(A), during step 208, a determination is made as to whether the engine 103 is turned off during a stop/start event. In a preferred embodiment, this determination is made by the processor 122 of FIG. 1 using information provided to the processor 122 by the sensors 108 of FIG. 1 during the above-described step 202.

If it is determined in step 208 that the engine is turned off during a stop/start event, then the volume gain for the infotainment system is set to a second level, "b" (step 210). In addition, this value is sent to the infotainment unit and/or a control system therefor for control of the volume of the infotainment unit accordingly, after which the process proceeds to step 212, discussed further below. In a preferred embodiment, the second level of volume gain "b" of step 210 is set to this level by the processor 122 of FIG. 1 and provided to the infotainment unit 102 of FIG. 1 and/or control system therefor via the bus 106 of FIG. 1. Conversely, if it is determined in step 208 that the engine is not turned off during a stop/start event, then the process proceeds instead directly to step 212, discussed below.

Figure 3B:
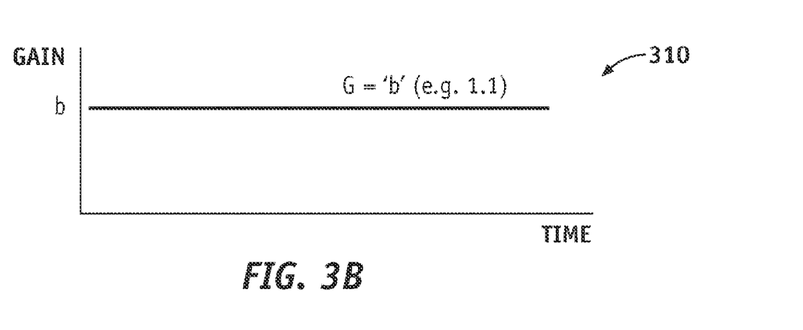

Turning now to FIG. 3B, an exemplary graph 310 represents an illustrative example of the second level of volume gain "b" of step 210 for the control of the infotainment unit, in accordance with one exemplary embodiment of the present invention. As depicted in FIG. 3B, in this exemplary embodiment, the second level of volume gain "b" is equal to a constant value that is greater than the first level of volume gain "a" of step 206 and FIG. 3(A). Specifically, in the embodiment depicted in FIG. 3(B), the second level of volume gain "b" of step 210 is equal to a constant value of 1.1. However, this may vary in other embodiments of the present invention.

Returning again to FIG. 2(A), during step 212, a determination is made as to whether the engine is running. In a preferred embodiment, this determination is made by the processor 122 of FIG. 1 using information provided to the processor 122 by the sensors 108 of FIG. 1 during the above-described step 202.

If it is determined in step 212 that the engine is running, then the volume gain for the infotainment system is set to a third level, "c" (step 214). In addition, this value is sent to the infotainment unit 102 and/or a control system 100 therefor for control of the volume of the infotainment unit 102 accordingly, after which the process proceeds to step 216, discussed further below. In a preferred embodiment, the third level of volume gain "c" of step 214 is set to this level by the processor 122 of FIG. 1 and provided to the infotainment unit 102 of FIG. 1 and/or control system 100 therefor via the bus 106 of FIG. 1. Conversely, if it is determined in step 212 that the engine is not running, then the process proceeds instead directly to step 216, discussed below.

Figure 3C:
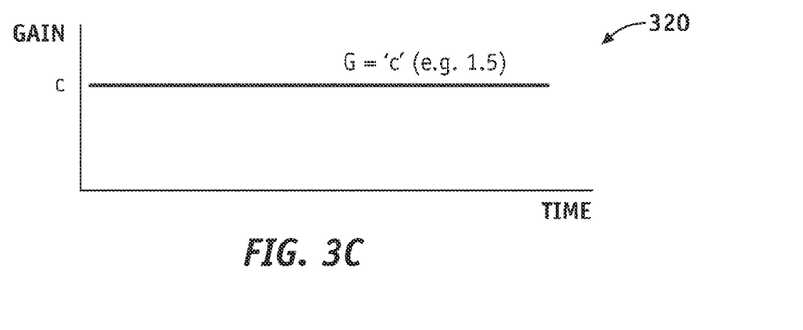

Turning now to FIG. 3C, an exemplary graph 320 represents an illustrative example of the third level of volume gain "c" of step 214 for the control of the infotainment unit 102, in accordance with one exemplary embodiment of the present invention. As depicted in FIG. 3C, in this exemplary embodiment, the third level of volume gain "c" is equal to a constant value that is greater than the first level of volume gain "a" of step 206 and the second level of volume gain "b" of step 210 and FIG. 3(B). Specifically, in the embodiment depicted in FIG. 3(C), the third level of volume gain "c" of step 214 is equal to a constant value of 1.5. However, this may vary in other embodiments of the present invention.

Returning again to FIG. 2(A), during step 216, a determination is made as to whether the engine 103 is cranking due to an engine stop/start event following an initial start of the vehicle during the current vehicle drive, or, alternatively phrased, during a current ignition key switch cycle. In a preferred embodiment, this determination is made by the processor 122 of FIG. 1 using information provided to the processor 122 by the sensors 108 of FIG. 1 during the above-described step 202.

If it is determined in step 216 that the engine 103 is cranking due to an engine stop/start event, then the volume gain for the infotainment system 102 is set to one or more fourth level(s), "d" (step 218). In addition, these value(s) are sent to the infotainment unit 102 and/or a control system 100 therefor for control of the volume of the infotainment unit 102 accordingly, after which the process returns to the above-described step 202 as additional engine condition information is obtained and the process begins again with a new iteration. In a preferred embodiment, the fourth level(s) of volume gain "d" of step 218 are set by the processor 122 of FIG. 1 and provided to the infotainment unit 102 of FIG. 1 and/or control system therefor via the bus 106 of FIG. 1. Conversely, if it is determined in step 216 that the engine 103 is not cranking due to an engine stop/start event, then the process proceeds instead directly to the above-described step 202 as additional engine condition information is obtained and the process begins again with a new iteration.

Turning now to FIG. 2B, an exemplary implementation of step 218 is depicted in accordance with an exemplary embodiment of the present invention. As depicted in FIG. 2B, in one preferred embodiment, this step comprises a subroutine beginning with the step of resetting and enabling a timer (step 220). Also, in a preferred embodiment, a look-up table 134 of values relating time to volume gains of the infotainment unit 102 is also read or referenced in step 220. In a preferred embodiment, these actions are performed by the processor 122 of FIG. 1 of the computer system 120 of FIG. 1. Also in a preferred embodiment, the timer corresponds to the timer 110 of the control system 100 of FIG. 1, and the look-up table corresponds to the look-up table 134 stored in the memory 124 of FIG. 1.

The timer 110 is then read, and corresponding values from the look-up table 134 are interpolated based on the timer 110 values, in order to determine the fourth level of gain "d" of the volume of the infotainment unit 102 (step 222). Specifically, in a preferred embodiment, the timer 110 value is read to determine an amount of time after which the current stop/start cranking event has begun, and this value of the amount of time is used in conjunction with the corresponding values from the look-up table 134 in order to determine the fourth level of gain "d" of the volume of the infotainment unit 102. However, this may vary in other embodiments. Also in a preferred embodiment, the interpolation is performed between a plurality of closest values as appropriate, in order to determine the fourth level of gain "d" of the volume of the infotainment unit at any particular point in time. However, this may also vary in other embodiments.

These fourth level(s) of gain of the volume of the infotainment unit 102 are then sent to the infotainment unit 102 and/or a control system 100 therefor for control of the volume of the infotainment unit 102 accordingly (step 224). In a preferred embodiment, the fourth level of gain "d" of step 222 is set to these levels by the processor 122 of FIG. 1 and provided to the infotainment unit 102 of FIG. 1 and/or control system 100 therefor via the bus 106 of FIG. 1 during step 224.

A determination is then made as to whether the stop/start event has concluded and/or is close to concluding (step 226). In a preferred embodiment depicted in FIG. 2B, this determination comprises a determination as to whether a stop/start crank command of an engine control system of the vehicle has ended. In a preferred embodiment, this determination is made by the processor 122 of the computer system 120 of FIG. 1.

Figure 3D:
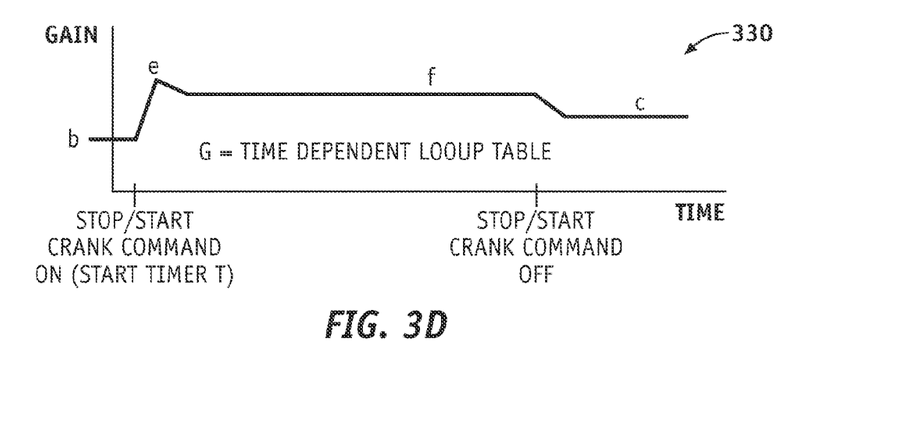

If it is determined in step 226 that the stop/start cranking event has not concluded and/or is not close to concluding, then the process returns to step 222. Steps 222-226 then repeat, as new timer 110 levels are read and new corresponding values of the forth level of gain "d" of the volume of the infotainment unit 102 are determined and provided to the infotainment unit and/or control system 100 therefor for use in controlling the volume of the infotainment unit 102. Specifically, in a preferred embodiment, during the various iterations of steps 222-226, the fourth level of gain "d" of the volume of the infotainment unit 102 varies throughout the duration of the stop/start cranking event based on the current time read from the timer 110 during each iteration and a corresponding expected noise associated with the stop/start cranking event based on the current time and known properties of stop/start events for this particular type of vehicle after the current time has elapsed after the start of an engine stop/start cranking event, as explained in greater detail below in connection with FIG. 3 (D).

Specifically, turning now to FIG. 3D, an exemplary graph 330 represents an illustrative example of the variation of the fourth level of volume gain "d" of steps 222 and 224 for the control of the infotainment unit, in accordance with one exemplary embodiment of the present invention. As depicted in FIG. 3D, in this exemplary embodiment, the fourth level of volume gain "d" increases quickly to a high point "e" shortly after the stop/start cranking event has begun, or, in a preferred embodiment, shortly after a stop/start crank command is provided by an engine control unit of the vehicle. In one preferred embodiment, the high point "e" for the volume gain is equal to is equal to a value of 2.5 for the gain. However, this may vary in other embodiments.

Also as depicted in FIG. 3D, in this exemplary embodiment, the fourth level of volume gain "d" then quickly decreases to an intermediate level "f" shortly thereafter, preferably after an amount of time in which the noise from the cranking of the engine's starter motor (not shown) has reduced to a significant extent. In one preferred embodiment, the intermediate level "f" for the volume gain is equal to a value of 2.0 for the gain. However, this may vary in other embodiments. Also in a preferred embodiment, the intermediate level "f" of volume gain is maintained until an amount of time passes such that the stop/start cranking event is completed and/or nearly completed, or, in a preferred embodiment, until a stop/start cranking command of an engine control system is off. However, this may also vary in other embodiments.

In addition, also as depicted in FIG. 3D, in this exemplary embodiment, the fourth level of volume gain "d" then decreases once again to the above-referenced third level of volume gain "c" once the stop/start cranking event is completed and/or nearly completed, or, in a preferred embodiment, once a stop/start command of an engine control system is off. As previously described, the third level of volume gain "c" preferably comprises a volume gain appropriate for operation of the infotainment unit while the engine is running. Also as described above, in one preferred embodiment, the third level of volume gain "c" is equal to a constant value of 1.5 in one exemplary embodiment of the present invention. However, this may vary in other embodiments.

Accordingly, improved methods, program products, and systems are provided for controlling the volume of infotainment units of vehicles having a stop/start engine feature during operation of the vehicle. The improved methods, program products, and system provide for adjustments of the volume of one or more infotainment units of the vehicle during various conditions of the engine, with the adjustments varying depending on the various engine conditions pertaining to stop/start events of the vehicle and the corresponding conditions of the vehicle. This allows for the driver and other occupants of the vehicle to enjoy listening to their infotainment devices at a more nearly constant level of volume above the background noise level and without the user manually fine tuning the volume controls during and after engine stop/start events. The improved methods, program products, and systems thereby provide for an improved driving experience for the driver and other occupants of the vehicle.

It will be appreciated that the disclosed methods, program products, and systems may vary from those depicted in the Figures and described herein. For example, as mentioned above, the control system 100 of FIG. 1 may be disposed in whole or in part in any one or more of a number of different vehicle units, devices, and/or systems. In addition, it will be appreciated that certain steps of the process 200 may vary from those depicted in FIGS. 2(A) and 2(B) and/or described herein in connection therewith. It will similarly be appreciated that certain steps of the process 200 may occur simultaneously or in a different order than that depicted in FIGS. 2(A) and 2(B) and/or described herein in connection therewith. It will similarly be appreciated that the disclosed methods, program products, and systems may be implemented and/or utilized in connection with any number of different types of automobiles, sedans, sport utility vehicles, trucks, and/or any of a number of other different types of vehicles, and in controlling any one or more of a number of different types of vehicle infotainment systems.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

We claim:

1. A method for controlling a volume of an infotainment unit of a vehicle having an engine having a stop/start capability during operation of the vehicle, the method comprising the steps of:
    obtaining information pertaining to a condition of the engine, wherein the condition of the engine comprises whether the engine is running, cranking, or turned off; and
    controlling the volume based at least in part upon the condition of the engine, wherein if the engine is turned off or cranking, the condition of the engine further comprises whether the engine is in a process of an initial start versus a stop/start cranking event following the initial start and the volume is controlled differently if the engine is in the process of an initial start versus a stop/start cranking event following the initial start.

2. The method of claim 1, wherein the step of controlling the volume comprises the steps of:
    providing no adjustment to the volume if the engine is turned off or cranking and the engine is in the process of the initial start;
    providing a first level of increase to the volume if the engine is turned off and the engine is in the process of the stop/start event following the initial start;
    providing a second level of increase to the volume if the engine is running; and
    providing a third level of increase to the volume if the engine is cranking and the engine is in the process of the stop/start cranking event following the initial start.

3. The method of claim 2, wherein:
    the first level of increase is equal to a first non-zero volume gain; and
    the second level of increase is equal to a second non-zero volume gain that is greater than the first non-zero volume gain.

4. The method of claim 2, further comprising the steps of:
    determining an amount of time after the engine has begun cranking during the stop/start event, if the engine is cranking and the engine is in the process of the stop/start event following the initial start; and
    determining the third level of increase based at least in part on the amount of time.

5. The method of claim 3, wherein the third level of increase is equal to a third non-zero volume gain that is greater than the first non-zero volume gain and is greater than the second non-zero volume gain.

6. The method of claim 4, wherein:
    the first level of increase is a first non-zero constant value;
    the second level of increase is a second non-zero constant value that is greater than the first constant value; and
    the third level of increase is a non-zero variable increase based on the amount of time.

7. The method of claim 4, wherein the step of determining the third level of increase comprises:
    setting the third level of increase to be equal to a fourth level of increase if the amount of time is greater than a first predetermined threshold and less than a second predetermined threshold, the second predetermined threshold being greater than the first predetermined threshold;
    setting the third level of increase to be equal to a fifth level of increase if the amount of time is greater than the second predetermined threshold and less than a third predetermined threshold, wherein the third predetermined threshold is greater than the second predetermined threshold; and
    setting the third level of increase to be equal to the second level of increase if the amount of time is greater than the third predetermined threshold, wherein:
    the fourth level of increase is greater than each of the first level of increase, the second level of increase, and the fifth level of increase; and
    the fifth level of increase is greater than each of the first level of increase and the second level of increase.

8. A program product for controlling a volume of an infotainment unit of a vehicle having an engine having a stop/start capability during operation of the vehicle, the program product comprising:
    a program configured to:
        obtain information pertaining to a condition of the engine, wherein the condition of the engine comprises whether the engine is running, cranking, or turned off; and
        control the volume based upon the condition of the engine;
        wherein if the engine is turned off or cranking, the condition of the engine further comprises whether the engine is in a process of an initial start versus a stop/start cranking event following the initial start and the volume is controlled differently if the engine is in the process of an initial start versus a stop/start cranking event following the initial start; and
    a non-transitory computer-readable signal-bearing media bearing the program.

9. The program product of claim 8, wherein the program is further configured to:
provide no adjustment to the volume if the engine is turned off or cranking and the engine is in the process of the initial start;
provide a first level of increase to the volume if the engine is turned off and the engine is in the process of the stop/start event following the initial start;
provide a second level of increase to the volume if the engine is running; and
provide a third level of increase to the volume if the engine is cranking and the engine is in the process of the stop/start cranking event following the initial start.

10. The program product of claim 9, wherein the program is further configured to:
determine an amount of time after the engine has begun cranking during the stop/start event, if the engine is cranking and the engine is in the process of the stop/start event following the initial start; and
determine the third level of increase based at least in part on the amount of time.

11. The program product of claim 9, wherein:
the first level of increase is equal to a first volume gain;
the second level of increase equal to a second volume gain that is greater than the first volume gain; and
the third level of increase is equal to a third non-zero volume gain that is greater than the first non-zero volume gain and is greater than the second non-zero volume gain.

12. A system for controlling a volume of an infotainment unit of a vehicle having an engine having a stop/start capability during operation of the vehicle, the system comprising:
one or more sensors configured to obtain information pertaining to a condition of the engine, wherein the condition of the engine comprises whether the engine is running, cranking, or turned off; and
a processor coupled to the one or more sensors and configured to control the volume based upon the condition of the engine;
wherein if the engine is turned off or cranking, the condition of the engine further comprises whether the engine is in a process of an initial start versus a stop/start cranking event following the initial start and the volume is controlled differently if the engine is in the process of an initial start versus a stop/start cranking event following the initial start.

13. The system of claim 12, wherein the processor is further configured to:
provide no adjustment to the volume if the engine is turned off or cranking and the engine is in the process of the initial start;
provide a first level of increase to the volume if the engine is turned off and the engine is in the process of the stop/start event following the initial start;
provide a second level of increase to the volume if the engine is running; and
provide a third level of increase to the volume if the engine is cranking and the engine is in the process of the stop/start cranking event following the initial start.

14. The system of claim 13, wherein:
the first level of increase is equal to a first non-zero volume gain; and
the second level of increase equal to a second non-zero volume gain that is greater than the first non-zero volume gain.

15. The system of claim 13, wherein the processor is further configured to:
determine an amount of time after the engine has begun cranking during the stop/start event, if the engine is cranking and the engine is in the process of the stop/start event following the initial start; and
determine the third level of increase based at least in part on the amount of time.

16. The system of claim 14, wherein the third level of increase is equal to a third non-zero volume gain that is greater than the first non-zero volume gain and is greater than the second non-zero volume gain.

17. The system of claim 15, wherein the processor is further configured to:
set the third level of increase to be equal to a fourth level of increase if the amount of time is greater than a first predetermined threshold and less than a second predetermined threshold, the second predetermined threshold being greater than the first predetermined threshold;
set the third level of increase to be equal to a fifth level of increase if the amount of time is greater than the second predetermined threshold and less than a third predetermined threshold, wherein the third predetermined threshold is greater than the second predetermined threshold; and
set the third level of increase to be equal to the second level of increase if the amount of time is greater than the third predetermined threshold, wherein:
the fourth level of increase is greater than each of the first level of increase, the second level of increase, and the fifth level of increase; and
the fifth level of increase is greater than each of the first level of increase and the second level of increase.

* * * * *